(12) United States Patent
El-Sharawy

(10) Patent No.: US 6,424,227 B1
(45) Date of Patent: Jul. 23, 2002

(54) MONOLITHIC BALANCED RF POWER AMPLIFIER

(75) Inventor: El-Badawy Amien El-Sharawy, Gilbert, AZ (US)

(73) Assignee: National Scientific Corporation, Scottsdale, AZ (US)

( * ) Notice: Subject to any disclaimer, the term of this patent is extended or adjusted under 35 U.S.C. 154(b) by 0 days.

(21) Appl. No.: 09/864,097

(22) Filed: May 23, 2001

(51) Int. Cl.[7] .............................. H03F 3/14; H03F 1/00; H03F 3/00; H03F 3/26; H03F 3/04
(52) U.S. Cl. ...................... 330/307; 330/165; 330/190; 330/276; 330/301
(58) Field of Search ................................ 330/165, 171, 330/188, 190, 195, 197, 276, 301, 307

(56) References Cited

U.S. PATENT DOCUMENTS

| | | | | |
|---|---|---|---|---|
| 3,727,078 A | * | 4/1973 | Wollesen | 327/113 |
| 4,133,025 A | * | 1/1979 | Wurzburg | 363/41 |
| 4,523,238 A | * | 6/1985 | Keel et al. | 360/46 |
| 5,061,910 A | | 10/1991 | Bouny | 333/26 |
| 5,477,204 A | | 12/1995 | Li | 336/200 |
| 5,497,137 A | | 3/1996 | Fujiki | 336/200 |
| 5,572,179 A | | 11/1996 | Ito et al. | 336/200 |
| 5,726,603 A | | 3/1998 | Chawla et al. | 330/269 |
| 5,892,425 A | | 4/1999 | Kuhn et al. | 336/200 |
| 5,930,128 A | * | 7/1999 | Dent | 307/80 |
| 6,009,314 A | | 12/1999 | Björk et al. | 455/83 |
| 6,097,250 A | | 8/2000 | Kamali et al. | 330/124 R |
| 6,097,273 A | | 8/2000 | Frye et al. | 336/200 |
| 6,201,439 B1 | | 3/2001 | Ishida et al. | 330/12 R |

* cited by examiner

*Primary Examiner*—Robert Pascal
*Assistant Examiner*—Patricia T. Nguyen
(74) *Attorney, Agent, or Firm*—Lowell W. Gresham; Charlene R. Jacobsen; Meschkow & Graham, P.L.C.

(57) ABSTRACT

An integrated RF power amplifier 20 includes an on-chip input transformer (24) and an on-chip output transformer (28). Each of the transformers (24, 28) is formed from four spirals. Each primary winding (34, 42) and each secondary winding (38, 44) includes positive and negative spirals arranged so that positive current rotates in opposing rotational directions in the positive and negative spirals. The secondary winding (38) of the input transformer (24) and the primary winding (42) of the output transformer (28) each has a center tap (48, 50) located at the electrical and physical center of the winding. Positive and negative amplifiers (26) couple between the secondary winding of the input transformer (24) and the primary winding of the output transformer (28). DC biasing for the amplifiers (26) is provided through the positive and negative spirals of the center-tapped windings (38, 42) from the respective center taps (48, 50).

22 Claims, 4 Drawing Sheets

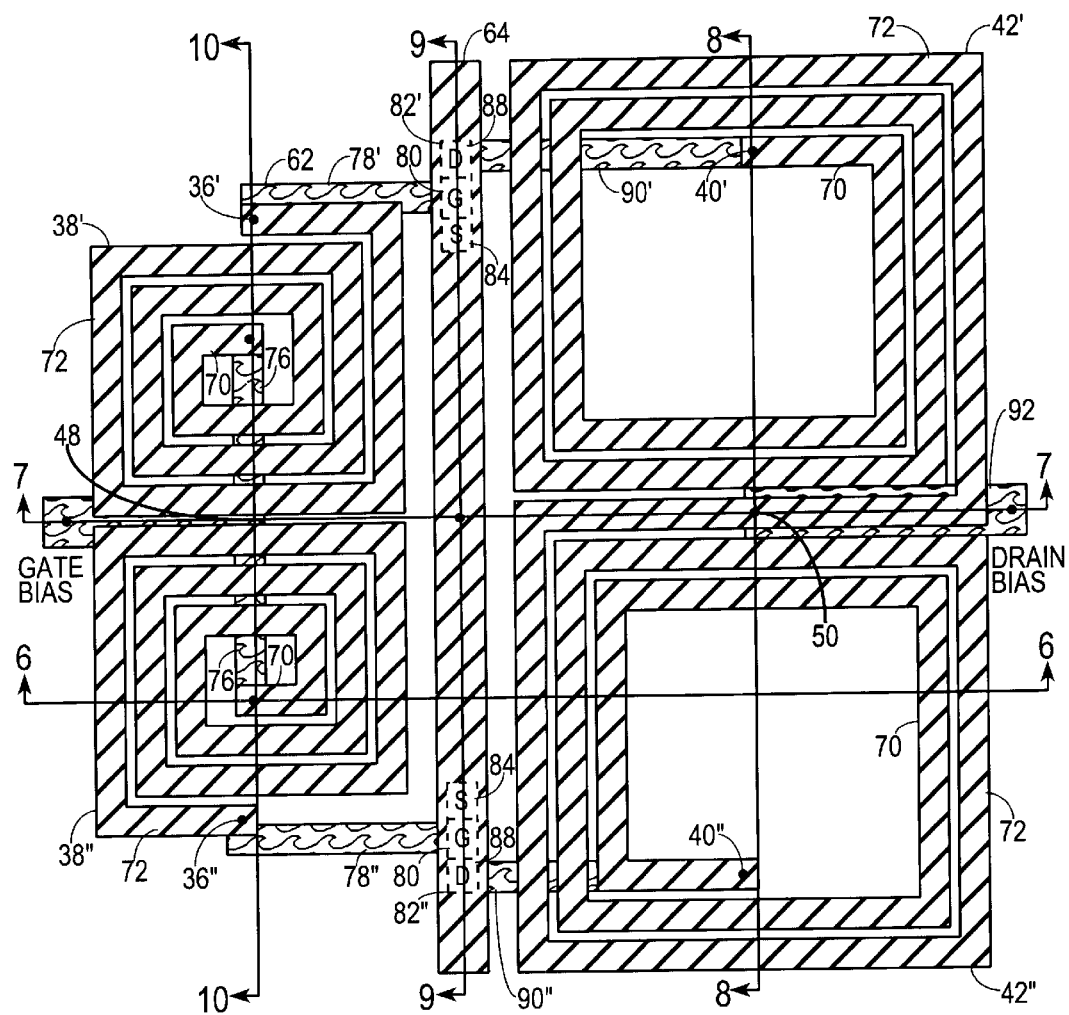
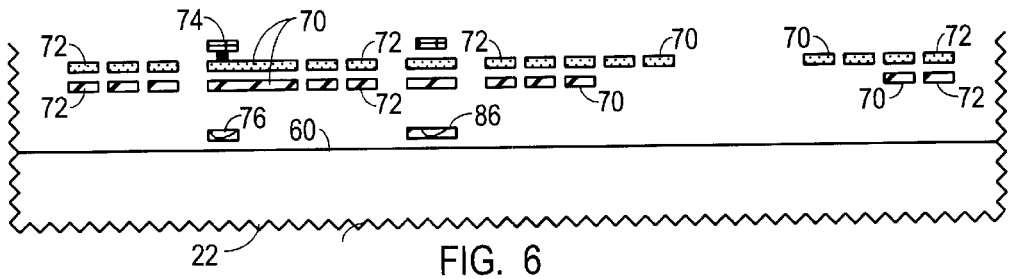
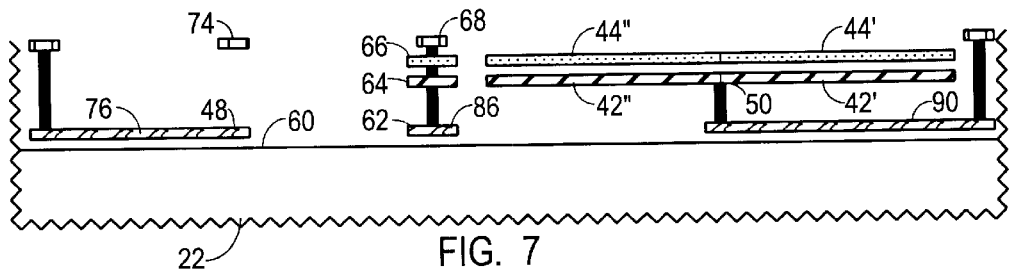
FIG. 5
FIG. 6
FIG. 7

MONOLITHIC BALANCED RF POWER AMPLIFIER

TECHNICAL FIELD OF THE INVENTION

The present invention relates generally to the field of radiofrequency (RF) communications. More specifically, the present invention relates to integrated circuit (IC) power amplifiers.

BACKGROUND OF THE INVENTION

A continuing need exists for lower power, less expensive, and physically smaller wireless devices to meet existing and future demands of portable and other electronic communications. Such demands are particularly prominent in cellular telephone, paging, wireless modem, and other applications. One area of inefficiency has been the power amplifier, which provides a signal amplification stage that operates on a radiofrequency (RF) signal prior to broadcasting the RF signal from an antenna.

Usually, benefits accrue in power amplifiers, as with other electronic devices, from forming as many electrical components together in a single integrated circuit (IC) as possible. When more components are included on a single IC, a physically smaller electrical device, reduced assembly times, reduced tuning requirements, reduced inventory management requirements, improved circuit reliability, improved circuit operation due to the use of matched components, and lower operating power may all be expected. Further benefits accrue when a given set of electronic functions can be carried out on an IC using less semiconductor die area. For example, a greater number of components can be produced from each wafer, thereby improving yields and reducing per-chip costs. Alternatively, a given die area can then accommodate more on-chip electronic functions.

A large number of communication applications is being developed to use RF signals in the 800 GHz–8 GHz range. The RF power amplifiers used in these applications would benefit if a greater number of electronic functions performed in and for RF power amplifiers could be performed on-chip and particularly if performed on-chip using as little die area as possible.

In the 800 GHz–8 GHz RF range, power amplifiers often require the use of multiple active devices, such as transistors. The formation of RF power transistors typically requires relatively little semiconductor die area. However, these power transistors are typically surrounded by input and output matching networks. Input matching networks match impedances between an incoming transmission line that brings the RF signal and the inputs of active devices, and the output matching networks match impedances between the outputs of the active devices and an outgoing transmission line which conveys the amplified RF signal to an antenna. Moreover, RF choking is typically used to provide biasing to the active devices and to decouple the active devices from one another. RF impedance matching networks and RF chokes typically use inductors, which are difficult to efficiently integrate with active devices in an IC.

Inductors have been difficult to integrate because a usable amount of inductance for the 800 GHz–8 GHz RF range has conventionally required an undesirably large amount of die area. Consequently, conventional RF power amplifiers typically rely upon some off-chip inductive components. For example, a couple of matching networks may be formed on-chip when each network requires only a single inductor exhibiting an inductance of no more than few nanohenries.

However, power amplifier designs which use several inductors, some of which may need to exhibit greater inductance values typically rely on one or more off-chip inductors. For example, each RF choke which provides biasing and decoupling for an active device typically exhibits an inductance value of more than 20 nanohenries and is located off-chip. Not only does the high inductance value make an off-chip implementation the more efficient option, but other off-chip tuning circuits may then be employed to minimize the influence the decoupling/choke inductor may have on impedance matching circuits, a complex influence often difficult to quantify prior to manufacture.

Transformers represent a class of inductive devices that may be used to match impedances. However, conventional on-chip transformer-forming techniques lead to either the consumption of an undesirably large amount of die area or an insufficient amount of inductance to achieve good magnetic coupling without suffering significant losses. Accordingly, using conventional techniques on-chip transformers provide little benefit over matching networks in the 800 GHz to 8 GHz RF range.

SUMMARY OF THE INVENTION

It is an advantage of the present invention that an improved monolithic balanced RF power amplifier is provided.

Another advantage of the present invention is that an integrated RF power amplifier is provided which uses an on-chip transformer both as a balun for input and/or output and to provide biasing to active devices.

Another advantage of the present invention is that an integrated RF power amplifier is provided which uses on-chip transformers as input and output baluns and to provide biasing to active devices.

Another advantage of the present invention is that an integrated RF power amplifier is provided which uses an on-chip transformer configured in an efficient manner so that losses are reduced and coupling between primary and secondary windings is increased.

These and other advantages are realized in one form by an improved monolithic balanced radiofrequency power amplifier. The power amplifier includes a semiconductor substrate. First and second transistors and a transformer are formed over the substrate. The transformer has a first conductive spiral coupled to the first transistor and residing over a first portion of the substrate so that positive current flows in a first rotational direction. A second conductive spiral couples to the second transistor and resides over a second portion of the substrate so that positive current flows in a second rotational direction which opposes the first rotational direction. A center tap resides between the first and second conductive spirals. A third conductive spiral is positioned over the first portion of the substrate, and a fourth conductive spiral is positioned over the second portion of the substrate. A source of direct current biasing for the first and second transistors couples to the center tap of the transformer.

BRIEF DESCRIPTION OF THE DRAWINGS

A more complete understanding of the present invention may be derived by referring to the detailed description and claims when considered in connection with the Figures, wherein like reference numbers refer to similar items throughout the Figures, and:

FIG. 5 shows a top view of inside and bottom metallization planes of the RF power amplifier of FIG. 2;

FIG. 6 shows a cross-sectional side view of the RF power amplifier of FIG. 2, taken at line 6—6 in FIGS. 4 and 5;

FIG. 7 shows a cross-sectional side view of the RF power amplifier of FIG. 2, taken at line 7—7 in FIGS. 4 and 5;

DETAILED DESCRIPTION OF THE PREFERRED EMBODIMENTS

Figure 1:
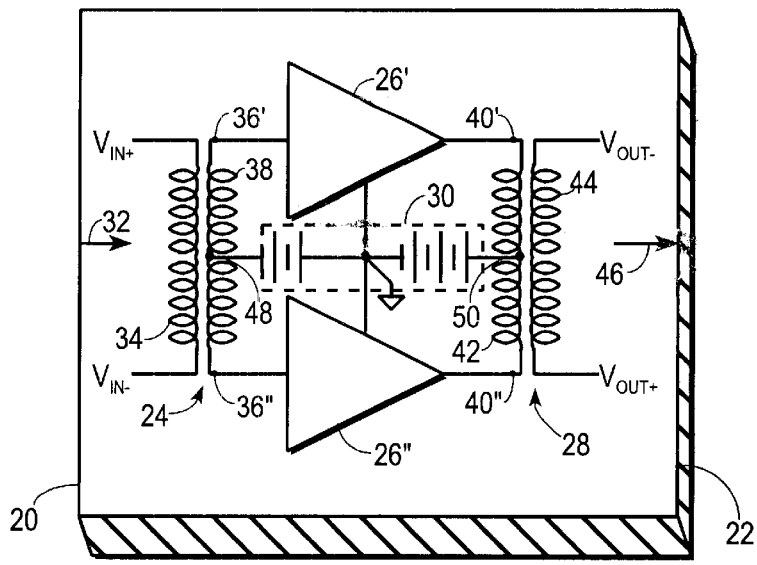
FIG. 1 shows a schematic circuit diagram of a radiofrequency (RF) power amplifier configured in accordance with the teaching of the present invention.

FIG. 1 shows a schematic circuit diagram of a radiofrequency (RF) power amplifier 20 configured in accordance with the teaching of the present invention. Power amplifier 20 is a monolithic amplifier in which bias-providing, impedance-matching, and amplification functions are all formed on a common semiconductor substrate. 22. In particular, power amplifier 20 includes an input transformer 24, positive and negative amplifiers 26' and 26", respectively, an output transformer 28, and a source of direct current biasing 30.

The preferred embodiment of the present invention described herein has several components which have substantially identical counterparts, in either a true, mirror image, or otherwise rotated fashion. The present description distinguishes such components from one another by appending a prime (') or double-prime (") designation to a reference number for the components. When such prime and double-prime designations are omitted herein, the reference number refers to either component individually or to both components collectively. Accordingly, power amplifier 20 is desirably a balanced configuration with positive and negative amplifiers 26 being substantially identical to one another and interconnected so as to provide substantially opposite polarity output signals at any given instant in time.

Moreover, the present description. uses the terms "positive" and "negative," or the like, to distinguish between components and signals which have a symmetrical counterpart elsewhere in power amplifier 20. Such terms are used merely in a relative sense for the purpose of distinguishing one from the other and do not indicate any absolute limitation, characteristic, or polarity. Thus, positive amplifier 26' and negative amplifier 26" are simply matched counterparts, and nothing requires either amplifier to operate on any particular polarity signal. Likewise, for purposes of distinguishing one direction from another, a positive current is arbitrarily defined herein as flowing from positive amplifier 26' to negative amplifier 26", and is thus distinguished from a negative current which would flow from negative amplifier 26" to positive amplifier 26'.

Input transformer 24 is adapted to receive an input RF signal 32, from an input transmission line (not shown). Input signal 32 may be conveyed by an unbalanced line, and transformer 24 serves as an input balun which matches the unbalanced input line to the balanced operation of power amplifier 20. Input signal 32 is received at a primary winding 34 of input transformer 24. Positive and negative terminals 36' and 36" of a secondary winding 38 of input transformer 24 respectively couple to inputs of positive and negative amplifiers 26' and 26".

Amplifiers 26 are desirably matched to one another. In other words, amplifiers 26 are desirably formed using a common transistor-forming process which simultaneously forms both amplifiers 26 using substantially the same process materials, process energy levels, process temperatures, process durations, and the like, so that both amplifiers have substantially the same dimensions on semiconductor substrate 20. Thus, amplifiers 26 should respond in a nearly identical fashion to identical signals. Each amplifier 26 desirably includes one or more transistors, whether bipolar, field effect, or the like, and other components as may be deemed desirable.

Outputs of positive and negative amplifiers 26' and 26" respectively couple to positive and negative terminals 40' and 40" of a primary winding 42 of output transformer 28. A secondary winding 44 of output transformer 28 provides an output signal 46 to an output transmission line (not shown). Output signal 46 may be conveyed to an unbalanced line, and transformer 28 serves as an output balun which matches the balanced operation of power amplifier 20 with such an unbalanced line.

Secondary winding 38 of input transformer 24 and primary winding 42 of output transformer 28 have center taps 48 and 50, respectively. Desirably, center taps 48 and 50 are located as close to the precise point that is both an electrical and physical center of secondary winding 38 and of primary winding 42, respectively, as practical. Accordingly, as discussed in more detail below, transformers 24 and 28 are configured to have positive and negative symmetrical halves so that the electrical and physical centers coincide.

Center taps 48 and 50 each couple to biasing source 30. Output center tap 50 couples to a positive DC voltage bias source, and input center tap 48 couples to a negative DC voltage bias source to properly bias the type of field effect transistors used in amplifiers 26 in the preferred embodiment. Those skilled in the art will appreciate that different types of transistors may be used in the present invention and that such different types of transistors may have different biasing requirements that may be satisfied by an appropriately configured biasing source 30. Moreover, those skilled in the art will appreciate that the schematic battery symbol used in FIG. 1 does not suggest that a battery must be formed on substrate 20. Rather, suitable voltages may be provided from off-chip and routed to where needed on-chip, with the conductive traces over which such biasing currents are routed serving as biasing source 30.

Although not specifically indicated in FIG. 1, semiconductor substrate 22 may support additional circuits not directly relevant to the present invention. Such additional circuits may, for example, include modulation circuits, additional capacitors or other decoupling or isolation circuits, power amplifier linearization circuits, and the like.

Figure 2:
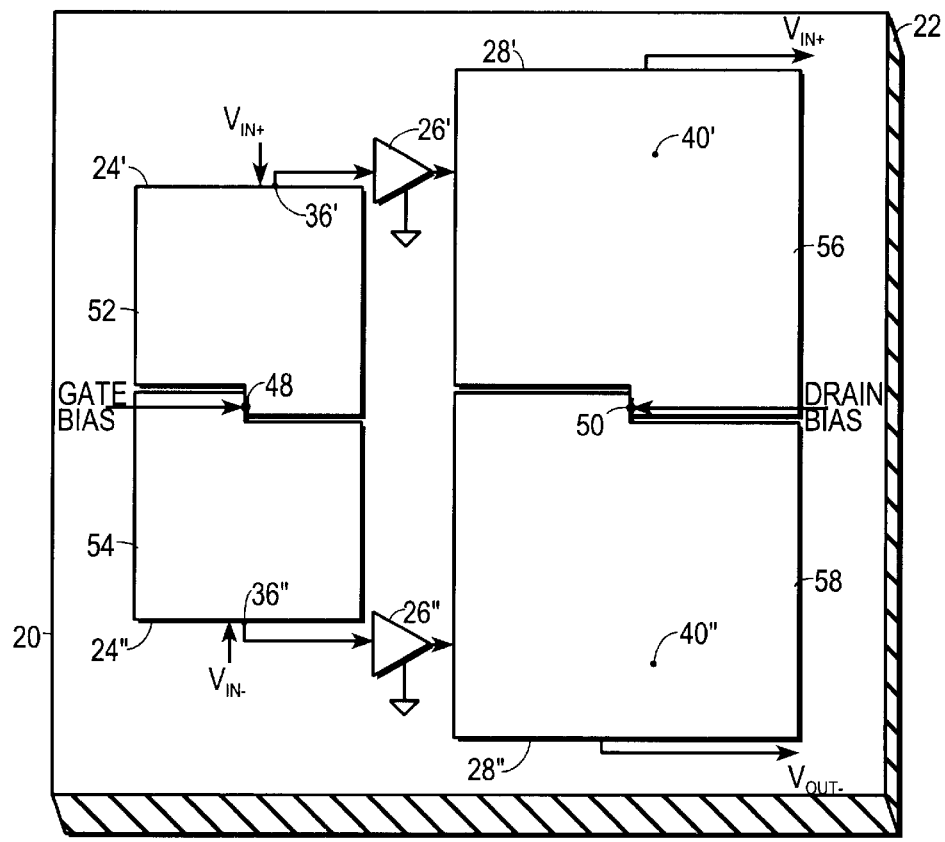
FIG. 2 shows a layout block diagram of one preferred embodiment of the RF power amplifier of FIG. 1.

FIG. 2 shows a top view of a layout block diagram of one preferred embodiment of RF power amplifier 20. Transformer 24 includes a positive half 24' that overlies a portion 52 of substrate 22 and a negative half 24" that overlies a portion 54 of substrate 22. Transformer 28 includes a positive half 28' that overlies a portion 56 of substrate 22, and a negative half 28" that overlies a portion 58 of substrate 22. Each of the positive and negative halves of input transformer 24 includes a portion of primary winding 34 (FIG. 1) and a portion of secondary winding 38 (FIG. 1). Each of the positive and negative halves of output transformer 28 includes a portion of primary winding 42 (FIG. 1) and a portion of secondary winding 44 (FIG. 1). The positive and negative halves of input transformer 24 intersect at a point where center tap 48 resides, and the positive and negative halves of output transformer 28 intersect at a point where center tap 50 resides. Input transformer 24 and output transformer 28 are laterally spaced apart from one another on substrate 22, with amplifiers 26 located in-between. Amplifiers 26 are also spaced laterally apart from one another. The spacing of input and output transformers 24 and 28 from one another helps reduce crosstalk, and the spacing of amplifiers 26 from one another helps with heat dissipation. However, such spacing is desirably held to a minimum to conserve precious die area.

Figure 3:
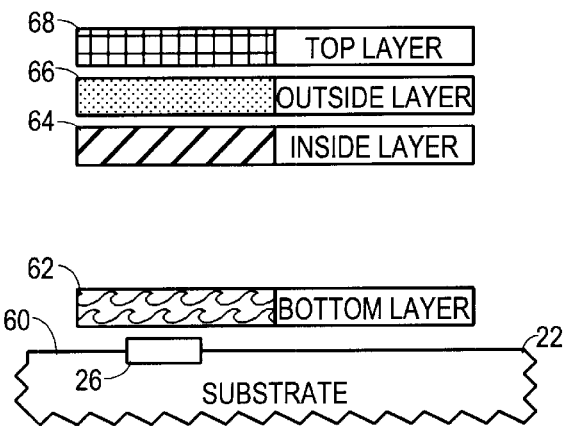
FIG. 3 shows a legend indicating cross-hatching and layer naming conventions used in connection with FIGS. 4–10.

FIGS. 4–10 show top and cross-sectional side views schematically depicting various features of power amplifier 20. FIG. 3 presents a legend indicating cross-hatching and layer naming conventions used in connection with FIGS. 4–10. Referring to FIG. 3, substrate 22 is deemed to be a lowermost layer for purposes of the present description. The transistors that form amplifiers 26 (FIGS. 1–2) may be formed in, on, and/or over substrate 22 at a surface 60. Alternate transistor forming processes in which all intrinsic transistors areas reside entirely above surface 60 may also be used. All transistor-forming processes are deemed to form transistors over substrate 22 for purposes of the present description.

A bottom metallization plane or layer 62 resides at some distance above surface 60. A suitable oxide or other insulative layer spaces metallization layer 62 apart from surface 60. While the spacing distance is not critical, it may be less than 1 micron. In the preferred embodiment, bottom layer 62 is used primarily for the formation of conductive traces that route signals to and from transformers 24 and 28 (FIG. 1).

Inside, then outside, then top metallization planes or layers 64, 66, and 68, respectively, reside above bottom layer 62. In the preferred embodiment described herein, secondary winding 38 (FIG. 1) and primary winding 42 (FIG. 1), each of which face the interior of power amplifier 20, are formed in inside layer 64. Primary winding 34 and secondary winding 44, each of which face the exterior of power amplifier 20, are formed in outside layer 66. Top layer 68 is used primarily for the formation of conductive traces that route signals to and from transformers 24 and 28 (FIG. 1) in the preferred embodiment described herein.

Each of layers 64, 66, and 68 is spaced apart from its adjacent layers by a suitable thickness of oxide or other insulative material. Desirably inside, outside, and top layers 64, 66, and 68 are spaced at the smallest distance apart from one another as practical for a given semiconductor formation process. Current techniques may achieve distances of around 0.7 microns, but smaller distances would be desirable, particularly between inside and outside layers 64 and 66, so long as the metallization does not bleed through the intervening insulative layer.

In the preferred embodiment, layers 64, 66, and 68 are spaced a considerable distance apart from bottom layer 62 and surface 60. Preferably, inside layer 64 resides at a distance away from surface 60 that is at least 75% of the distance away from surface 60 where outside layer 66 resides. If a considerable amount of the magnetic flux generated from the windings of transformers 24 and 28 were allowed to extend into substrate 22, then increased losses would result, Q would diminish, and transformers 24 and 28 would need to occupy a greater die area to accomplish the same task. Accordingly, this distance, when combined with other techniques discussed below, helps keep the magnetic flux away from substrate 22. In the preferred embodiment, inside layer 64 may be spaced 3–5 microns above surface 60.

Figure 4:
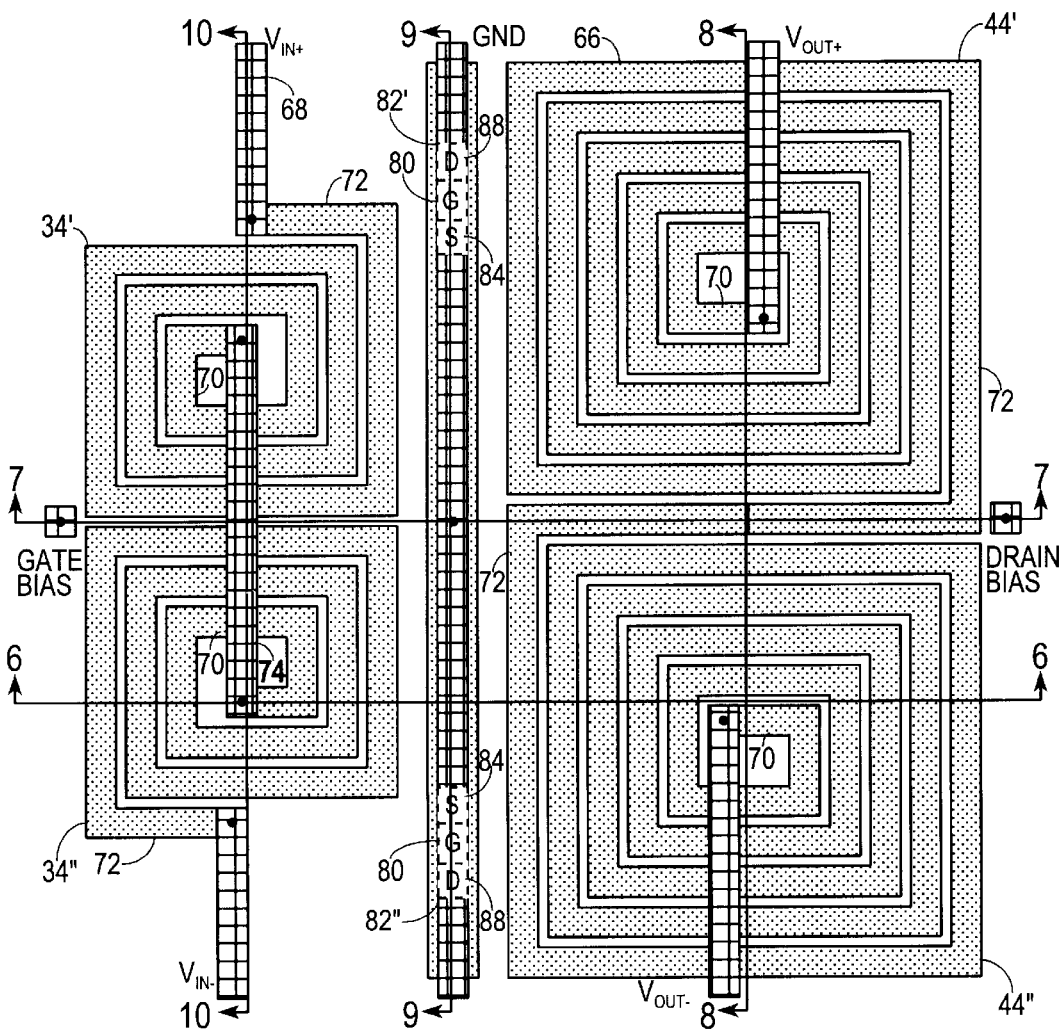
FIG. 4 shows a top view of top and outside metallization planes of the RF power amplifier of FIG. 2.
Figure 8:
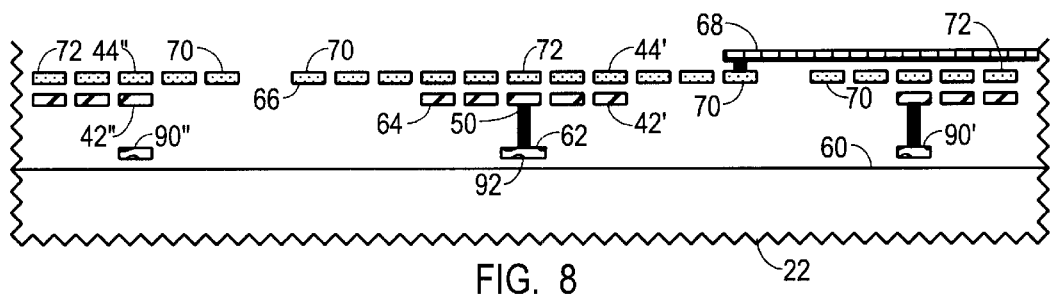
FIG. 8 shows a cross-sectional side view of the RF power amplifier of FIG. 2, taken at line 8—8 in FIGS. 4 and 5.
Figure 9:
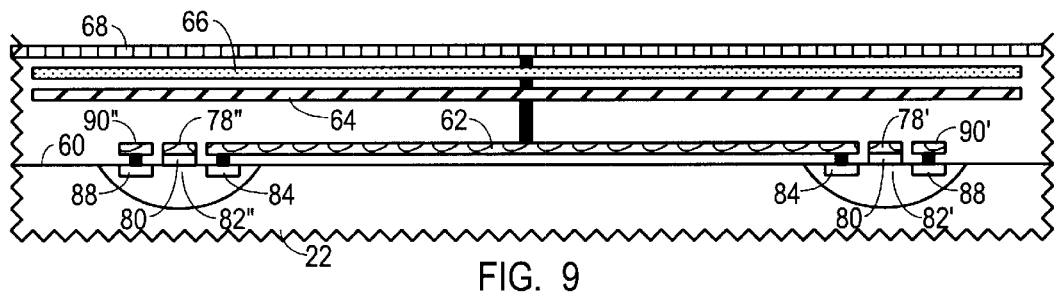
FIG. 9 shows a cross-sectional side view of the RF power amplifier of FIG. 2, taken at line 9—9 in FIGS. 4 and 5.
Figure 10:
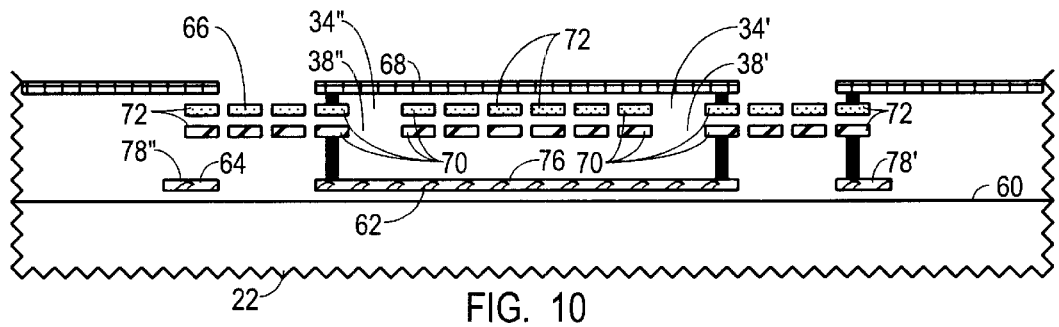
FIG. 10 shows a cross-sectional side view of the RF power amplifier of FIG. 2, taken at line 10—10 in FIGS. 4 and 5.

FIG. 4 shows a top view of top and outside metallization layers 68 and 66, respectively. FIG. 5 shows a top view of inside and bottom metallization layers 64 and 62, respectively. FIG. 6 shows a cross-sectional side view of this preferred embodiment of power amplifier 20 taken at line 6—6 in FIGS. 4 and 5. Line 6—6 extends across the negative halves 24" and 28" of input and output transformers 24 and 28, respectively. FIG. 7 shows a cross-sectional side view of this preferred embodiment of power amplifier 20, taken at line 7—7 in FIGS. 4 and 5. Line 7—7 resides where the negative halves 24" and 28" of transformers 24 and 28 intersect the positive halves 24' and 28' . FIG. 8 shows a cross-sectional side view of this preferred embodiment of power amplifier 20, taken at line 8—8 in FIGS. 4 and 5. Line 8—8 resides at the center of the positive and negative halves 28' and 28" of output transformer 28. FIG. 9 shows a cross-sectional side view of this preferred embodiment of power amplifier 20, taken at line 9—9 in FIGS. 4 and 5. Line 9—9 resides in the region between input and output transformers 24 and 28 so as to intersect transistors which are used in amplifiers 26. (FIGS. 1–2). FIG. 10 shows a cross-sectional side view of this preferred embodiment of power amplifier 20, taken at line 10—10 in FIGS. 4 and 5. Line 10—10 resides at the center of the positive and negative halves 24' and 24" of input transformer 24.

Referring to FIGS. 4–10, each of input and output transformers 24 and 28 is formed from four conductive spirals formed in metallization layers 64 and 66. For input transformer 24, a positive spiral 34' (FIGS. 4 and 10) of primary winding 34 (FIG. 1) resides in outside layer 66 and represents the first one of its four spirals, a negative spiral 34" (FIGS. 4, 6, and 10) of primary winding 34 (FIG. 1) resides in outside layer 66 and represents the second one of its four spirals, a positive spiral 38' (FIGS. 5 and 10) of secondary winding 38 (FIG. 1) resides in inside layer 64 and represents the third one of its four spirals, and a negative spiral 38" (FIGS. 5, 6, and 10) of secondary winding 38 (FIG. 1) resides in inside layer 64 and represents the fourth one of its four spirals. For output transformer 28, a positive spiral 42' (FIGS. 5 and 8) of primary winding 42 (FIG. 1) resides in inside layer 64 and represents the first one of its four spirals, a negative spiral 42" (FIGS. 5, 6, and 8) of primary winding 42 (FIG. 1) resides in inside layer 64 and represents the second one of its four spirals, a positive spiral 44' (FIGS. 4 and 8) of secondary winding 44 (FIG. 1) resides in outside layer 66 and represents the third one of its four spirals, and a negative spiral 44" (FIGS. 5, 6 and 8) of secondary winding 44 (FIG. 1) resides in outside layer 66 and represents the fourth one of its four spirals.

A number of variations in winding direction, interconnection, and other design factors can be used with spirals 34', 34", 38', 38", 42', 42", 44' and 44". Nevertheless, in order to minimize the amount of magnetic flux generated by transformers 24 and 28 that extends into substrate 22, the positive and negative halves of respective transformers 24 and 28 are desirably arranged so that their flux lines point in opposing directions. In other words, spirals are configured so that a common current passing through two laterally spaced apart spirals of different polarity (i.e., positive and negative), spirals in opposing directions. The common current could be either a positive current in both spirals or a negative current in both-spirals.

In order to achieve as precise a coincidence between the electrical and physical center points where center taps 48 and 50 are located, a certain amount of symmetry is desirable between the positive and negative spirals of the windings which have center taps. In particular, it is desirable that the different polarity spirals of a winding have the same number of turns and be wound in the same rotational direction (i.e., either clockwise or counterclockwise). This form of symmetry allows a center tap to be located on a connecting trace between innermost turns 70 of both spirals or on a connecting trace between outermost turns 72 of both spirals.

Furthermore, in order to maximize the coupling between primary and secondary windings, same-polarity spirals in different windings are wound in the same direction and overlie substantially the same amount of die area. The best coupling appears to result when the conductive traces of same-polarity spirals in different windings of a transformer are of the same width and are spaced perpendicularly away from one another so as to directly overlie and underlie one another. However, acceptable results are achieved if the traces of one spiral overlie/underlie some or all of the interstitial distances between traces of the corresponding spiral in the other winding.

Quality factor Q improves when spirals are wound as tightly as practical, with as little interstitial distance between the conductive traces that make up the spiral turns as practical. Likewise, mutual inductance and Q improve when the opposing polarity spirals which constitute a common winding of a transformer are placed as close together as practical. These factors lead to occupying less die area. However, Q and inter-winding coupling improves when traces are wider, and this factor causes the transformer to occupy a greater amount of die area.

FIGS. 4–10 depict two of the various different spiral winding and interconnection techniques which provide suitable results in accordance with the teaching of the present invention. Input transformer 24 exemplifies one technique while output transformer 28 exemplifies the other. Those skilled in the art will appreciate that these two techniques are presented for exemplary purposes and that nothing necessitates the use of either of these two techniques or of different techniques between input transformer 24 and output transformer 28.

Primary spirals 34' and 34" of input transformer 24 each wind in a counterclockwise (CCW) direction, when viewed from the top and from center to outside. Desirably, spirals 34' and 34" are as nearly identical to one another in all dimensions as practical, but they are rotated 180° relative to one another.

Input signal 32 (FIG. 1) is applied at the ends of outermost turns 72 of spirals 34' and 34", and the centers of spirals 34' and 34" are interconnected through a trace 74 in top layer 68. Current flowing from the end of outermost turn 72 of spiral 34' to the end of outermost turn 72 of spiral 34" spirals clockwise (CW) in spiral 34' then CCW in spiral 34", thereby causing the flux lines generated in spiral 34' to pass through the center of spiral 34' in the opposite direction to flux lines generated in spiral 34" and passing through the center of spiral 34". Of course, current and flux lines actually alternate at RF frequencies. Nevertheless, at all times flux lines flowing out of one of spirals 34 toward substrate 22 are pulled into the center of the other of spirals 34 with little contact with substrate 22 due to the close proximity of spirals 34 to one another and the above-discussed considerable spacing away from substrate 22.

Secondary spirals 38' and 38" are desirably configured as nearly identical to primary spirals 34' and 34", respectively, as practical and positioned so that outermost turns 72 of positive spirals 34' and 38' enclose substantially the same area and so that outermost turns 72 of negative spirals 34" and 38" enclose substantially the same area. A trace 76 in bottom layer 62 interconnects the centers of spirals 38' and 38". Center tap 48 is positioned in the center of trace 76 at a point which is between spirals 38' and 38". Traces 78' and 78" in bottom layer 62 conduct signals from the ends of outermost turns 72 of spirals 38' and 38" to gates 80 of field effect transistors (FET) 82' and 82", respectively.

In this example, secondary spirals 38' and 38" have the same number of turns as primary spirals 34' and 34". This example is appropriate when the input impedances of FETs 82 are approximately equal to the impedance of the input transmission line over which input signal 32 (FIG. 1) is conveyed. of course, equal impedances are no requirement, and when different impedances are present, then different numbers of turns would be implemented in primary spirals 34 and secondary spirals 38, as discussed below in connection with output transformer 28.

In this preferred embodiment, positive amplifier 26' is provided by FET 82' and negative amplifier 26" is provided by FET 82". Gate biasing is provided for through trace 76 and respective secondary spirals 38. Accordingly, secondary spirals serve dual roles in providing biasing to FETs 82 and impedance matching with the input transmission line. Sources 84 of FETs 82 couple to ground through a ground trace 86 in bottom layer 62. Drains 88 of FETs 82 provide the output signals from amplifiers 26. In other FET configurations, drains 88 couple to ground and sources 84 may provide outputs.

Drains 88 of FETs 82' and 82" couple to the ends of innermost turns 70 of primary spirals 42' and 42" through traces 90' and 90" in bottom layer 62. The ends of outermost turns 72 in spirals 42' and 42" abut at center tap 50. Drain biasing for FETs 82' and 82" is provided to primary spirals 42' and 42' at center tap 50 through a trace 92 formed in bottom layer 62.

Each of primary spirals 42 is wound in a CW rotational direction, when viewed from the top and from center to outside. Current flowing from drain 82' to drain 82" flows in a CW rotational direction in positive primary spiral 42' and in a CCw rotational direction in negative primary spiral 42". Desirably, spirals 42' and 42" are as nearly identical to one another in all dimensions as practical, but they are rotated 180° relative to one another. As with input transformer 24, flux lines are generated in spiral 42' to pass through the center of spiral 42' in the opposite direction to flux lines generated in spiral 42" and passing through the center of spiral 42". At all times flux lines flowing out of one of spirals 42 toward substrate 22 are pulled into the center of the other of spirals 42 with little contact with substrate 22 due to the close proximity of spirals 42 to one another and the above-discussed considerable spacing away from substrate 22.

Secondary spirals 44' and 44" are desirably configured to be as nearly identical to spirals 42' and 42" as practical. Spirals 44 are wound in the same direction and have outermost turns 72 which enclose the same area as spirals 42. However, output transformer 28 is configured to match impedances between lower impedance FETs 82 and a higher impedance output transmission line. Hence, spirals 42 and 44 have a different numbers of turns, with a greater number of turns being provided by secondary spirals 44 than by primary spirals 42. The additional turns provided by secondary spirals 44 reside on the inside of the spirals to ensure good flux coupling between primary and secondary spirals. Thus, while outermost turns 72 of primary and secondary spirals 42 and 44 are spaced substantially perpendicularly away from one other, innermost turns 70 of primary spirals 42 are spaced obliquely away from innermost turns 70 of secondary spirals 44.

In summary, an improved monolithic balanced RF power amplifier 20 is provided. RF power amplifier 20 uses an on-chip transformer 24, 28 both as a balun for input and/or output and to provide biasing to active devices, such as FETs 82. RF power amplifier 20 uses an on-chip transformer 24, 28 configured in an efficient manner so that losses are reduced and coupling between primary and secondary windings is increased.

Although the preferred embodiments of the invention have been illustrated and described in detail, it will be readily apparent to those skilled in the art that various modifications may be made therein without departing from the spirit of the invention or from the scope of the appended claims.

What is claimed is:

1. A monolithic balanced radiofrequency power amplifier comprising:
    a semiconductor substrate;
    a first transistor formed over said substrate;
    a second transistor formed over said substrate;
    a transformer having a first conductive spiral coupled to said first transistor and residing over a first portion of said substrate so that positive current flows in a first rotational direction, a second conductive spiral coupled to said second transistor and residing over a second portion of said substrate so that positive current flows in a second rotational direction which opposes said first rotational direction, a center tap between said first and second conductive spirals, a third conductive spiral positioned over said first portion of said substrate, and a fourth conductive spiral positioned over said second portion of said substrate; and
    a source of direct current biasing for said first and second transistors coupled to said center tap of said transformer.

2. A monolithic balanced radiofrequency power amplifier as claimed in claim 1 wherein:
    said first conductive spiral is wound in a first rotational direction; and
    said second conductive spiral is wound in said first rotational direction.

3. A monolithic balanced radiofrequency power amplifier as claimed in claim 2 wherein:
    said third conductive spiral is wound in said first rotational direction; and
    said fourth conductive spiral is wound in said first rotational direction.

4. A monolithic balanced radiofrequency power amplifier as claimed in claim 1 wherein:
    said first conductive spiral and said third conductive spiral are wound in the same direction; and
    said second conductive spiral and said fourth conductive spiral are wound in the same direction.

5. A monolithic balanced radiofrequency power amplifier as claimed in claim 1 wherein:
    said first conductive spiral has a smaller number of turns than said third conductive spiral; and
    said second conductive spiral has a smaller number of turns than said fourth conductive spiral.

6. A monolithic balanced radiofrequency power amplifier as claimed in claim 5 wherein:
    an outermost turn of said first conductive spiral encloses substantially the same area as is enclosed by an outermost turn of said third conductive spiral; and
    an outermost turn of said second conductive spiral encloses substantially the same area as is enclosed by an outermost turn of said fourth conductive spiral.

7. A monolithic balanced radiofrequency power amplifier as claimed in claim 5 wherein:
    said first and second conductive spirals are formed substantially in a first plane;
    said third and fourth conductive spirals are formed substantially in a second plane, said second plane being spaced apart from and substantially parallel to said first plane;
    outermost turns of said first and second conductive spirals are each spaced substantially perpendicularly away from outermost turns of said third and fourth conductive spirals, respectively; and
    innermost turns of said first and second conductive spirals are each spaced obliquely away from innermost turns of said third and fourth conductive spirals, respectively.

8. A monolithic balanced radiofrequency power amplifier as claimed in claim 1 wherein:
    said first and second transistors are a first distance from said substrate;
    said first and second conductive spirals of said transformer are each a second distance from said substrate;
    said third and fourth conductive spirals of said transformer are each a third distance from said substrate;
    said first distance is less than said second distance; and
    said second distance is less than said third distance.

9. A monolithic balanced radiofrequency power amplifier as claimed in claim 8 wherein said second distance is at least 80% of said third distance.

10. A monolithic balanced radiofrequency power amplifier as claimed in claim 1 wherein:
    said first and second conductive spirals together form a combined primary winding of said transformer; and
    said center tap is located at a point of said primary winding that is both an electrical center and a physical center of said primary winding.

11. A monolithic balanced radiofrequency power amplifier as claimed in claim 1 wherein:
    said first and second conductive spirals together form a combined secondary winding of said transformer; and
    said center tap is located at a point of said secondary winding that is both an electrical center and a physical center of said secondary winding.

12. A monolithic balanced radiofrequency power amplifier as claimed in claim 1 wherein said transformer is an output balun of said radiofrequency power amplifier, and said radiofrequency power amplifier additionally comprises an input balun formed over said substrate and coupled to said first and second transistors.

13. A monolithic balanced radiofrequency power amplifier as claimed in claim 12 wherein said input balun is a transformer comprising:
    a fifth conductive spiral coupled to said first transistor and located over a third portion of said substrate;
    a sixth conductive spiral coupled to said second transistor and located over a fourth portion of said substrate, said fifth and sixth conductive spirals being wound and coupled to said first and second transistors, respectively, so that positive electrical current flows in opposing rotational directions;

an input center tap positioned between said fifth and sixth conductive spirals;

a seventh conductive spiral positioned over said third portion of said substrate; and an eighth conductive spiral positioned over said fourth portion of said substrate.

14. A monolithic balanced radiofrequency power amplifier as claimed in claim 13 wherein said input center tap couples to a source of direct current biasing for said first and second transistors.

15. A monolithic balanced radiofrequency power amplifier as claimed in claim 14 wherein:

said first conductive spiral couples to a drain or a source of said first transistor;

said second conductive spiral couples to a drain or a source of said second transistor;

said fifth conductive spiral couples to a gate of said first transistor; and said sixth conductive spiral couples to a gate of said second transistor.

16. A monolithic balanced radiofrequency power amplifier as claimed in claim 12 wherein said input balun is laterally spaced apart from said output balun, and said first and second transistors are located between said input balun and said output balun.

17. A monolithic balanced radiofrequency power amplifier as claimed in claim 1 wherein said first transistor is substantially identical to said second transistor.

18. A monolithic balanced radiofrequency power amplifier comprising:

a semiconductor substrate;

a first transistor formed over said substrate;

a second transistor formed over said substrate;

a first conductive spiral coupled to said first transistor and residing over a first portion of said substrate so that positive current flows in a first rotational direction, said first conductive spiral exhibiting a first predetermined number of turns;

a second conductive spiral coupled to said second transistor and residing over a second portion of said substrate so that positive current flows in a second rotational direction which opposes said first rotational direction, said second conductive spiral exhibiting substantially said first predetermined number of turns;

a center tap coupled to said first and second conductive spirals substantially at both an electrical and physical center of said first and second conductive spirals;

a third conductive spiral positioned over said first portion of said substrate, said third conductive spiral exhibiting a second predetermined number of turns, said second predetermined number of turns being greater than said first predetermined number of turns;

a fourth conductive spiral positioned over said second portion of said substrate, said fourth conductive spiral exhibiting substantially said second predetermined number of turns; and a source of direct current biasing for said first and second transistors coupled to said center tap.

19. A monolithic balanced radiofrequency power amplifier as claimed in claim 18 wherein:

said first and second transistors are a first distance from said substrate;

said first and second conductive spirals are each a second distance from said substrate;

said third and fourth conductive spirals are each a third distance from said substrate;

said first distance is less than said second distance; and said second distance is less than said third distance.

20. A monolithic balanced radiofrequency power amplifier as claimed in claim 18 wherein said first, second, third, and fourth conductive spirals together form an output balun of said radiofrequency power amplifier, and said radiofrequency power amplifier additionally comprises an input balun formed over said substrate and coupled to said first and second transistors.

21. A monolithic balanced radiofrequency power amplifier as claimed in claim 20 wherein said input balun comprises:

a fifth conductive spiral coupled to said first transistor and located over a third portion of said substrate;

a sixth conductive spiral coupled to said second transistor and located over a fourth portion of said substrate, said fifth and sixth conductive spirals being wound and coupled to said first and second transistors, respectively, so that positive electrical current flows in opposing rotational directions;

an input balun center tap positioned between said fifth and sixth conductive spirals, said input center tap being coupled to said source of direct current biasing;

a seventh conductive spiral positioned over said third portion of said substrate; and an eighth conductive spiral positioned over said fourth portion of said substrate.

22. A monolithic balanced radiofrequency power amplifier comprising:

a semiconductor substrate;

a first transistor formed over said substrate, said first transistor having a drain, a source, and a gate;

a second transistor formed over said substrate, said second transistor having a drain, a source, and a gate;

a first conductive spiral coupled to either said drain or said source of said first transistor and residing over a first portion of said substrate so that positive current flows in a first rotational direction, said first conductive spiral exhibiting a first predetermined number of turns;

a second conductive spiral coupled to either said drain or said source of said second transistor and residing over a second portion of said substrate so that positive current flows in a second rotational direction which opposes said first rotational direction, said second conductive spiral exhibiting substantially said first predetermined number of turns;

an output center tap coupled to said first and second conductive spirals substantially at both an electrical and physical center of said first and second conductive spirals;

a third conductive spiral positioned over said first portion of said substrate, said third conductive spiral exhibiting a second predetermined number of turns, said second predetermined number of turns being greater than said first predetermined number of turns;

a fourth conductive spiral positioned over said second portion of said substrate, said fourth conductive spiral exhibiting substantially said second predetermined number of turns;

a fifth conductive spiral coupled to said gate of said first transistor and located over a third portion of said substrate;

a sixth conductive spiral coupled to said gate of said second transistor and located over a fourth portion of said substrate, said fifth and sixth conductive spirals being wound and coupled to said first and second transistors, respectively, so that positive electrical current flows in opposing rotational directions;

an input center tap positioned between said fifth and sixth conductive spirals;

a seventh conductive spiral positioned over said third portion of said substrate;

an eighth conductive spiral positioned over said fourth portion of said substrate; and a source of direct current biasing for said first and second transistors coupled to said output center tap and said input center tap.

* * * * *

UNITED STATES PATENT AND TRADEMARK OFFICE
CERTIFICATE OF CORRECTION

PATENT NO.    : 6,424,227 B1  
DATED         : July 23, 2002  
INVENTOR(S)   : El-Sharawy It is certified that error appears in the above-identified patent and that said Letters Patent is hereby corrected as shown below:

Column 1,  
Line 37, replace "800 GHz" with -- 800 Mhz --.  
Line 44, replace "800 GHz" with -- 800 Mhz --.  
Line 61, replace "800 GHz" with -- 800 Mhz --.

Column 2,  
Line 21, replace "800 GHz" with -- 800 Mhz --.

Signed and Sealed this

Twenty-sixth Day of November, 2002

*Attest:*

*Attesting Officer*

JAMES E. ROGAN  
*Director of the United States Patent and Trademark Office*